US010026705B2

(12) United States Patent
Kim et al.

(10) Patent No.: US 10,026,705 B2
(45) Date of Patent: Jul. 17, 2018

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Da Hee Kim, Suwon-si (KR); Young Gwan Ko, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/404,813

(22) Filed: Jan. 12, 2017

(65) Prior Publication Data

US 2018/0061794 A1    Mar. 1, 2018

(30) Foreign Application Priority Data

Aug. 31, 2016 (KR) .......................... 10-2016-0111749

(51) Int. Cl.
*H01L 23/00* (2006.01)
*H01L 23/31* (2006.01)
(Continued)

(52) U.S. Cl.
CPC ............ *H01L 24/09* (2013.01); *H01L 23/293* (2013.01); *H01L 23/3128* (2013.01);
(Continued)

(58) Field of Classification Search
USPC ........................................................ 257/773
See application file for complete search history.

(56) References Cited

U.S. PATENT DOCUMENTS 9,040,361 B2 *  5/2015  Chang .................... H01L 24/20
                                              438/126
9,330,994 B2    5/2016  Camacho et al.
(Continued)

FOREIGN PATENT DOCUMENTS

KR    10-2013-0132161 A    12/2013
KR    10-2013-0132162 A    12/2013
KR    10-2013-0132163 A    12/2013

OTHER PUBLICATIONS

Taiwanese Office Action issued in corresponding Taiwanese Patent Application No. 106100904, dated Feb. 13, 2018, with English Translation.

*Primary Examiner* — Marcos D Pizarro
*Assistant Examiner* — Lawrence Tynes, Jr.
(74) *Attorney, Agent, or Firm* — McDermott Will & Emery LLP

(57) ABSTRACT

A fan-out semiconductor package includes: a first connection member having a through-hole; a semiconductor chip disposed in the through-hole and having an active surface having connection pads disposed thereon and an inactive surface opposing the active surface; an encapsulant encapsulating at least portions of the first connection member and the inactive surface of the semiconductor chip; a second connection member disposed on the first connection member and the active surface of the semiconductor chip; a resin layer disposed on the encapsulant; and a rear redistribution layer embedded in the encapsulant so that one surface thereof is exposed by the encapsulant, wherein the resin layer covers at least portions of the exposed one surface of the rear redistribution layer, and the rear redistribution layer is electrically connected to the redistribution layer of the first connection member through connection members formed in first openings penetrating through the resin layer and the encapsulant.

21 Claims, 13 Drawing Sheets

(51) Int. Cl.
*H01L 23/29* (2006.01)
*H01L 23/528* (2006.01)

(52) U.S. Cl.
CPC ............... *H01L 23/5283* (2013.01); *H01L 2224/02373* (2013.01); *H01L 2224/02379* (2013.01)

(56) References Cited

U.S. PATENT DOCUMENTS

| | | |
|---|---|---|
| 9,818,683 B2 * | 11/2017 | Chiang ............. H01L 23/49838 |
| 2012/0119373 A1 | 5/2012 | Hunt |
| 2013/0062751 A1 | 3/2013 | Takagi et al. |
| 2013/0062761 A1 | 3/2013 | Lin et al. |
| 2013/0134581 A1 * | 5/2013 | Lin ...................... H01L 21/563 |
| | | 257/737 |
| 2013/0249101 A1 | 9/2013 | Lin et al. |
| 2014/0131858 A1 | 5/2014 | Pan et al. |
| 2016/0118333 A1 | 4/2016 | Lin |
| 2016/0338202 A1 * | 11/2016 | Park ........................ H01L 23/48 |
| 2017/0103951 A1 * | 4/2017 | Lee .................... H01L 21/4857 |
| 2017/0133309 A1 * | 5/2017 | Kim .................... H01L 23/3128 |
| 2017/0148716 A9 * | 5/2017 | Chiang ............. H01L 23/49838 |

* cited by examiner

FAN-OUT SEMICONDUCTOR PACKAGE

CROSS-REFERENCE TO RELATED APPLICATION(S)

This application claims benefit of priority to Korean Patent Application No. 10-2016-0111749 filed on Aug. 31, 2016 in the Korean Intellectual Property Office, the disclosure of which is incorporated herein by reference in its entirety.

TECHNICAL FIELD

The present disclosure relates to a semiconductor package, and more particularly, to a fan-out semiconductor package in which connection terminals may extend outwardly of a region in which a semiconductor chip is provided.

BACKGROUND

Recently, a significant recent trend in the development of technology related to semiconductor chips is reducing the size of semiconductor chips. Therefore, in the field of semiconductor package technology, in accordance with a rapid increase in demand for small sized semiconductor chips, or the like, the implementation of a semiconductor package having a compact size while including a plurality of pins has been demanded.

One type of package technology suggested to satisfy the technical demand as described above is a fan-out semiconductor package. Such a fan-out semiconductor package has a compact size and may implement a plurality of pins by redistributing connection terminals outwardly of a region in which a semiconductor chip is provided.

SUMMARY

An aspect of the present disclosure may provide a fan-out semiconductor package solving the problem of a decrease in the yield of semiconductor chips.

According to an aspect of the present disclosure, a fan-out semiconductor package, in which a rear redistribution layer may be introduced before a semiconductor chip is disposed, may be provided.

According to an aspect of the present disclosure, a fan-out semiconductor package may include: a first connection member having a through-hole; a semiconductor chip disposed in the through-hole of the first connection member and having an active surface having connection pads disposed thereon and an inactive surface disposed to oppose the active surface; an encapsulant encapsulating at least portions of the first connection member and the inactive surface of the semiconductor chip; a second connection member disposed on the first connection member and the active surface of the semiconductor chip; a resin layer disposed on the encapsulant; and a rear redistribution layer embedded in the encapsulant so that one surface thereof is exposed, wherein the first connection member and the second connection member include, respectively, redistribution layers electrically connected to the connection pads of the semiconductor chip, the resin layer covers at least portions of the exposed one surface of the rear redistribution layer, and the rear redistribution layer is electrically connected to the redistribution layer of the first connection member through connection members formed in first openings penetrating through the resin layer and the encapsulant.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
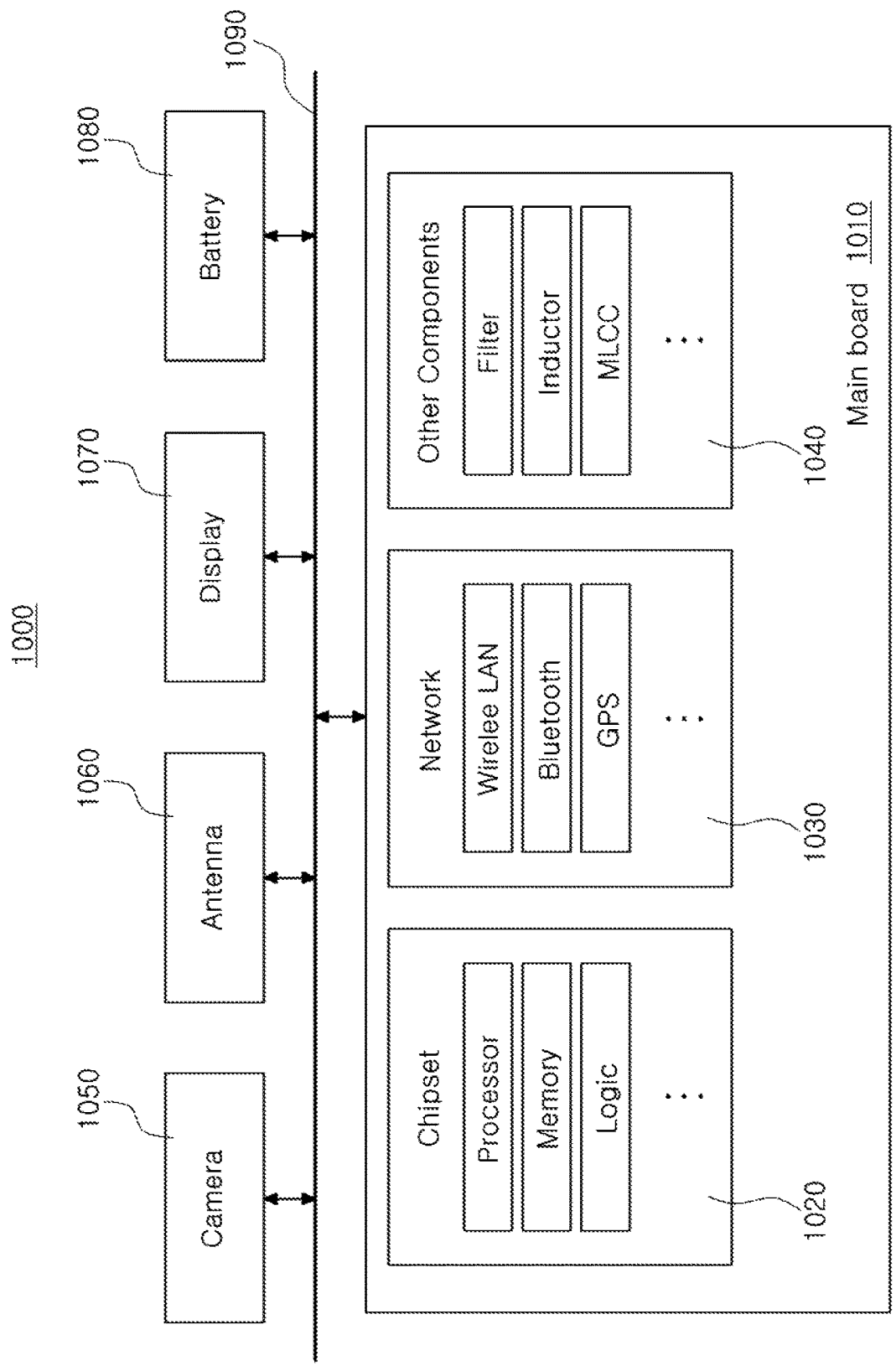
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like, or the like. However, the chip-related components 1020 are not limited thereto, but may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the main board 1010. The other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, the other components are not limited thereto, but may also include additional components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
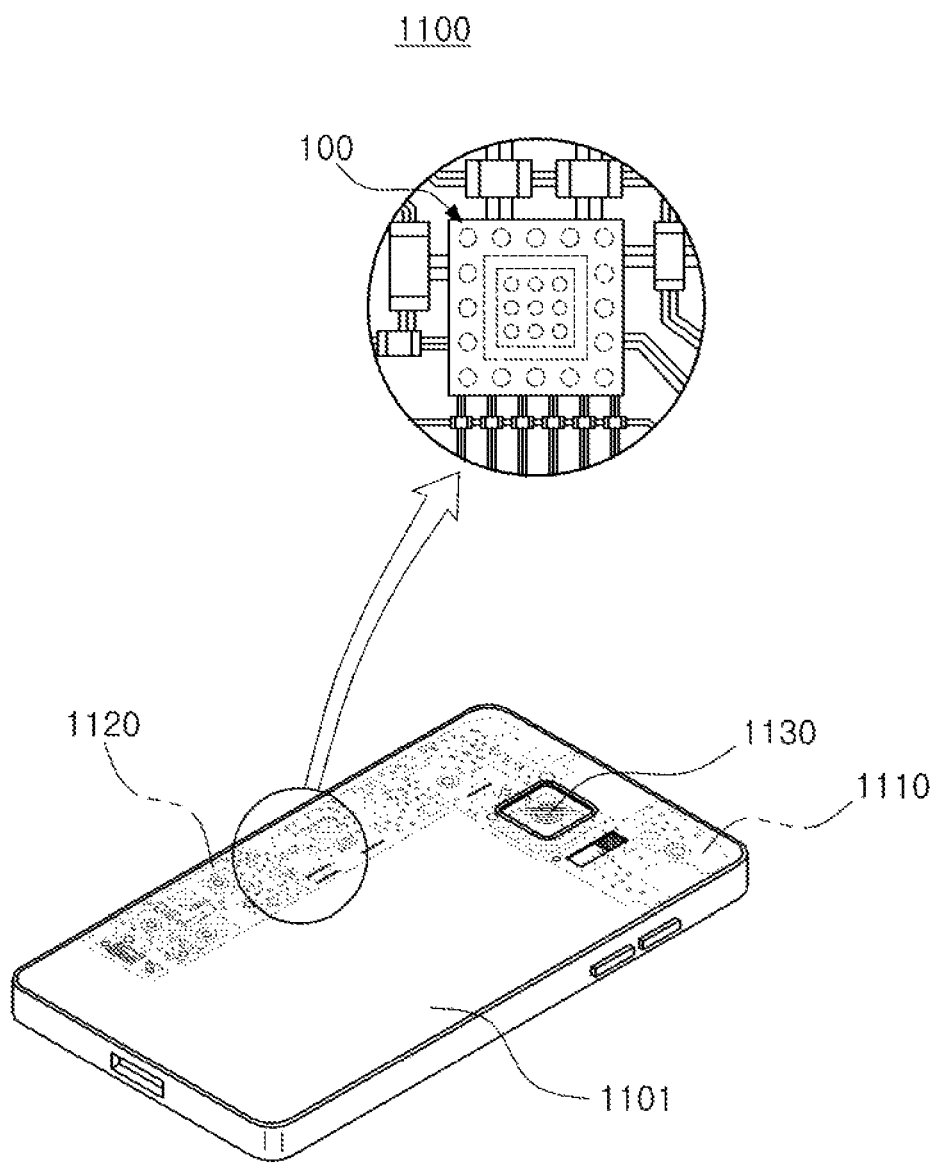
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1130, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, and may be other electronic devices as described above.

Semiconductor Package

Generally, a number of fine electrical circuits may be integrated in a semiconductor chip. However, the semiconductor chip may not serve as a finished semiconductor product in itself, and may be damaged due to external physical or chemical impacts. Therefore, the semiconductor chip itself is not used, but is packaged and is used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package, depending on a structure and a purpose thereof.

The fan-in semiconductor package and the fan-out semiconductor package will hereinafter be described in more detail with reference to the drawings.

Fan-in Semiconductor Package

Figure 3B:
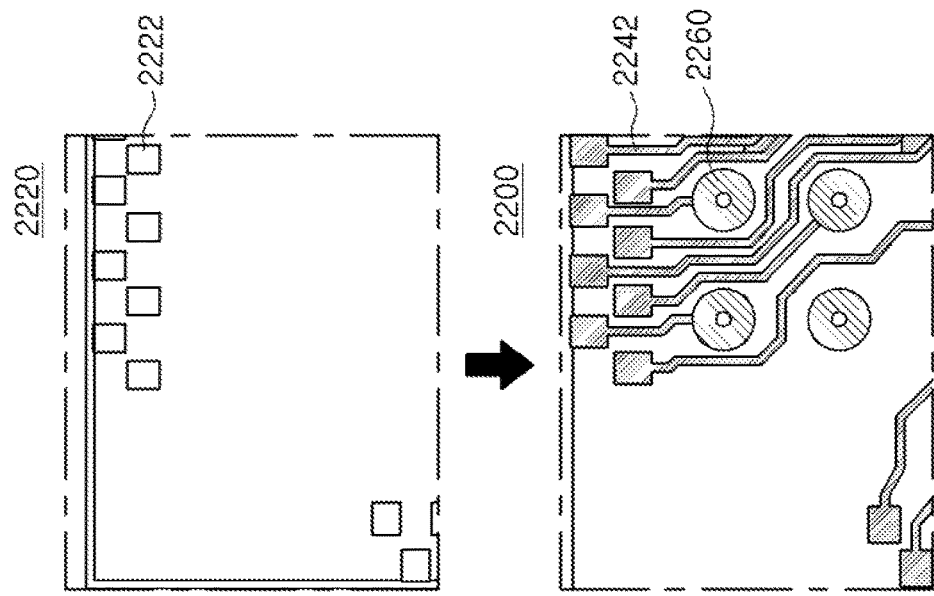
FIGS. 3A and 3B are schematic cross-sectional views illustrating states of a fan-in semiconductor package before and after being packaged.
Figure 3A:
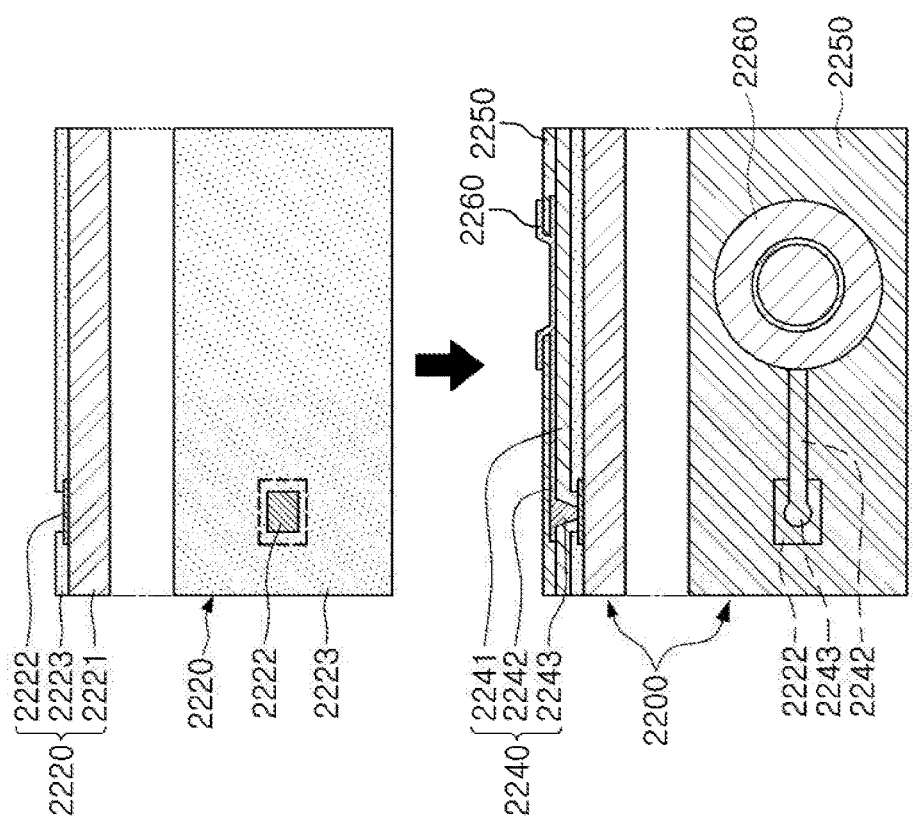

FIGS. 3A and 3B are schematic cross-sectional views illustrating states of a fan-in semiconductor package before and after being packaged.

Figure 4:
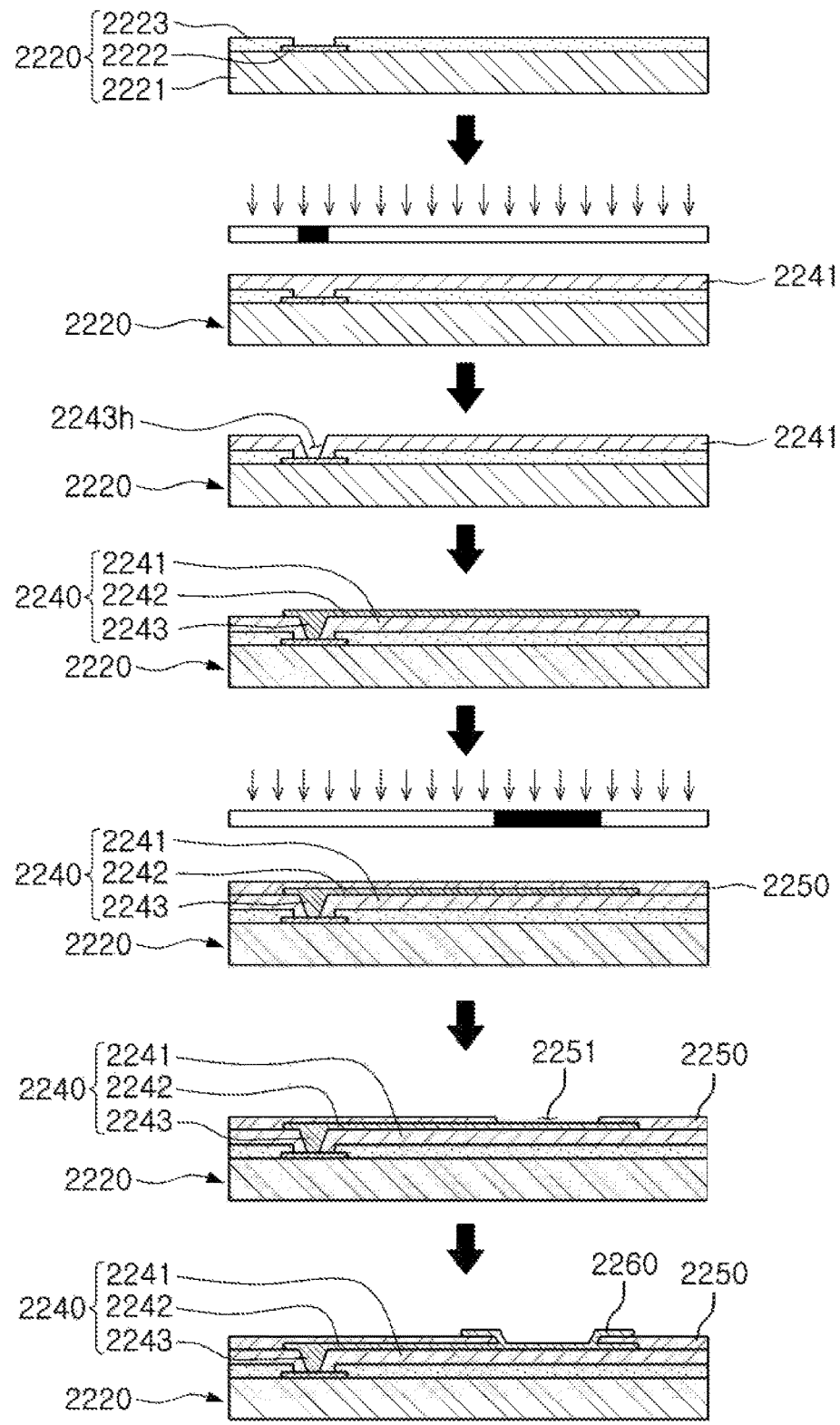
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, a connection member 2240 may be formed on the semiconductor chip 2220, depending on a size of the semiconductor chip 2220, in order to redistribute the connection pads 2222. The connection member 2240 may be formed by forming an insulating layer 2241 on the semiconductor chip 2220 using an insulating material such as a photoimagable dielectric (PID) resin, forming via holes 2243h exposing the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all connection pads, for example, input/output (I/O) terminals, of the semiconductor chip are disposed inside the semiconductor chip, may have excellent electrical characteristics and may be able to be produced at low cost. Therefore, many elements mounted in a smartphone have been manufactured in fan-in semiconductor package form. In detail, many elements mounted in the smartphone have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. In this regard, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not sufficient to directly mount the fan-in semiconductor package on the main board of the electronic device.

Figure 5:
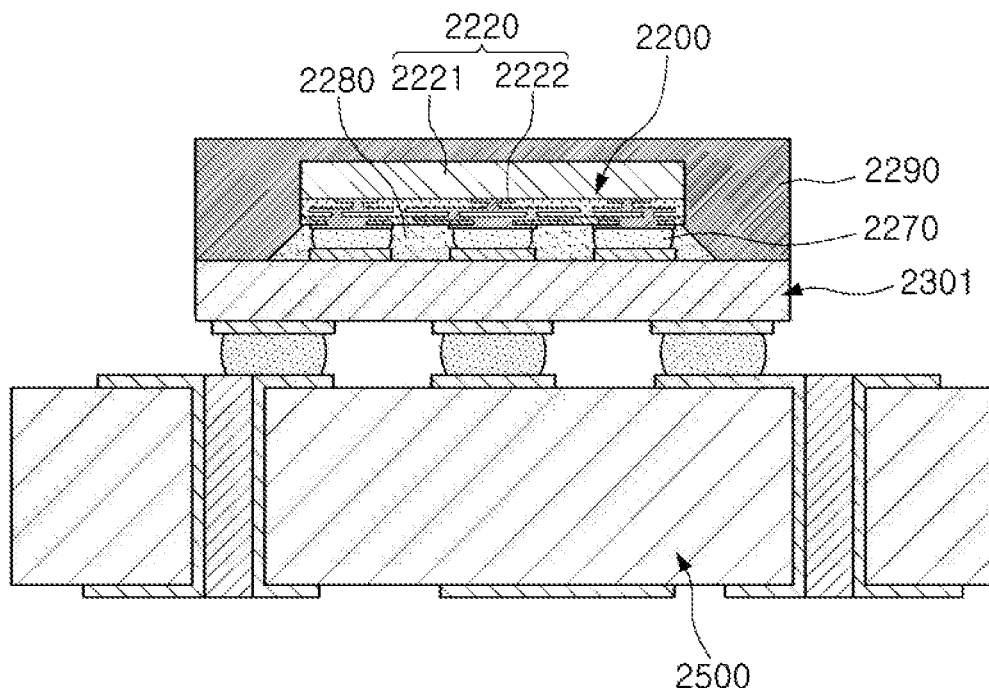
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
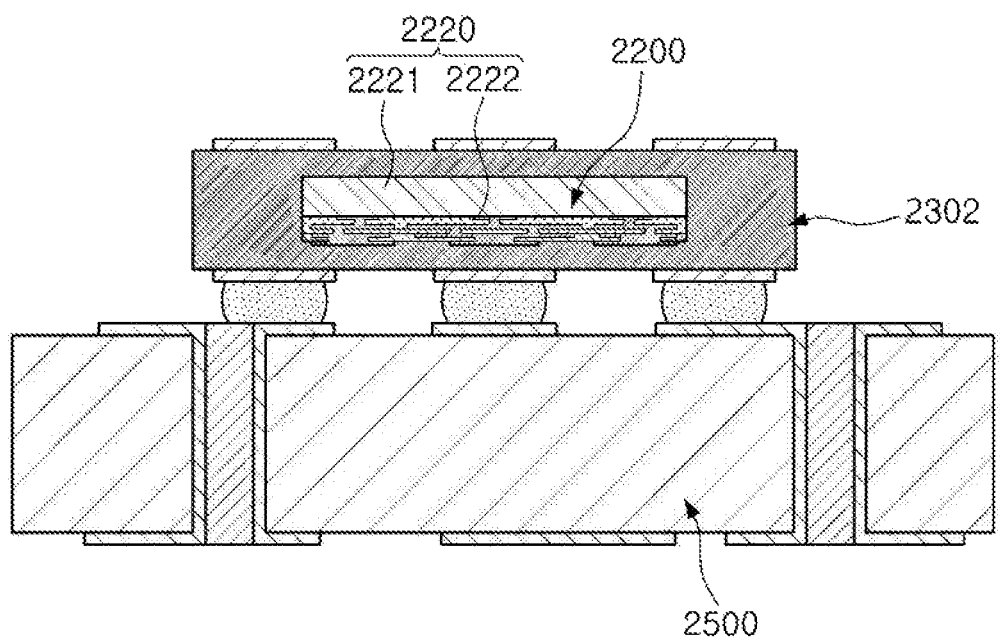
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and then mounted on the main board of the electronic device through a packaging process or may be mounted and used on the main board of the electronic device in a state in which it is embedded in the interposer substrate.

Fan-Out Semiconductor Package

Figure 7:
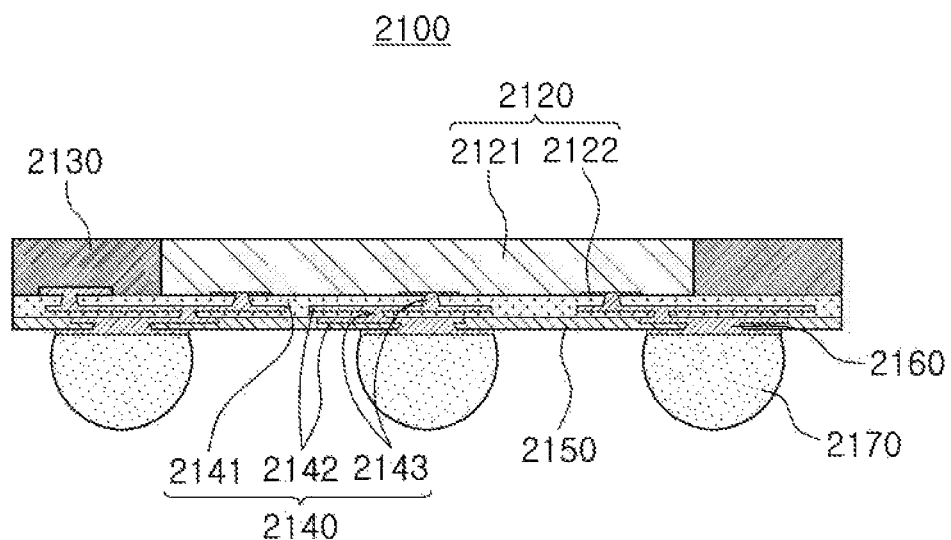
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 may be redistributed outwardly of the semiconductor chip 2120 by a connection member 2140. In this case, a passivation layer 2150 may be formed on the connection member 2140, and underbump metal layers 2160 may be formed in openings of the passivation layer 2150. Solder balls 2170 may be formed on the underbump metal layers 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even though a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
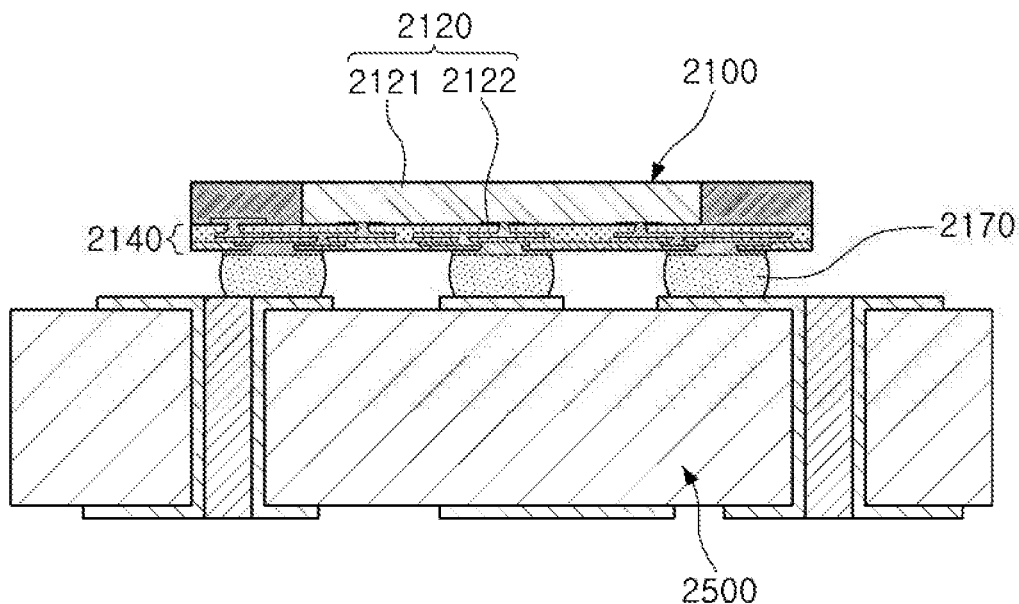
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size range of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a decrease in a yield of a semiconductor chip may be significantly reduced will be hereinafter described with reference to the drawings.

Figure 9:
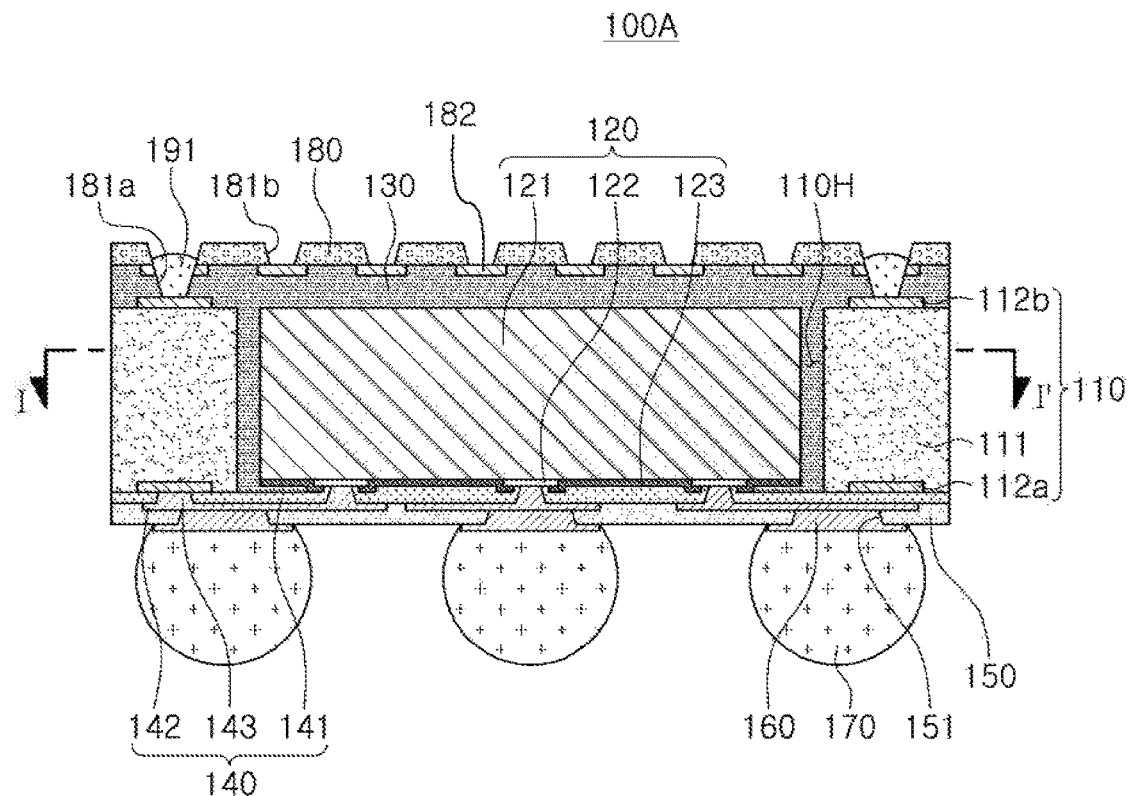
FIG. 9 is a schematic cross-sectional view illustrating an example of a fan-out semiconductor package.

FIG. 9 is a schematic cross-sectional view illustrating an example of a fan-out semiconductor package.

Figure 10:
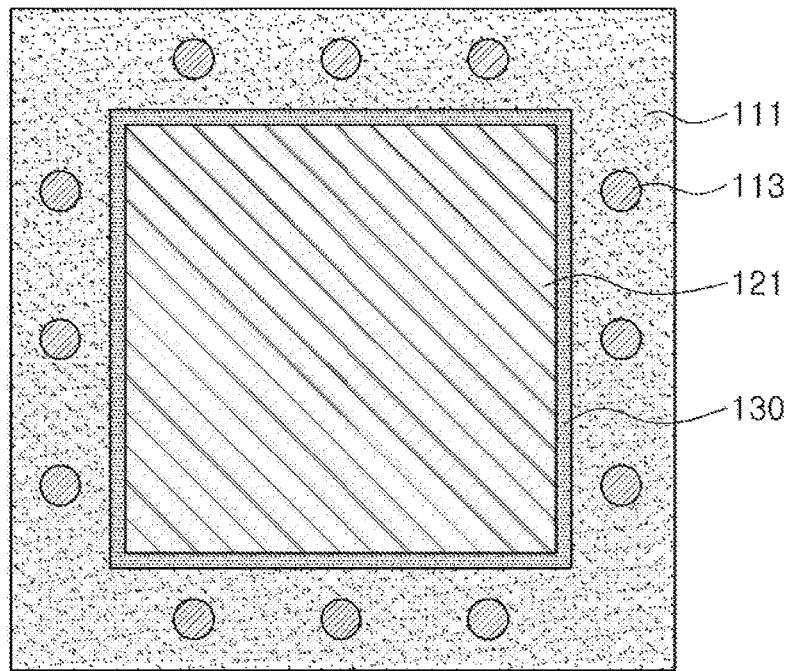
FIG. 10 is a schematic plan view taken along line I-I' of the fan-out semiconductor package of FIG. 9.

FIG. 10 is a schematic plan view taken along line I-I' of the fan-out semiconductor package of FIG. 9.

FIGS. 11A through 11D are schematic cross-sectional views illustrating various forms of vias formed in a first connection member of the fan-out semiconductor package of FIG. 9.

Referring to the drawings, a fan-out semiconductor package 100A according to an exemplary embodiment in the present disclosure may include a first connection member 110 having a through-hole 110H, a semiconductor chip 120 disposed in the through-hole 110H of the first connection member 110 and having an active surface having connection pads 122 disposed thereon and an inactive surface disposed to oppose the active surface, an encapsulant 130 encapsulating at least portions of the first connection member 110 and the inactive surface of the semiconductor chip 120, a second connection member 140 disposed on the first connection member 110 and the active surface of the semiconductor chip 120, and a resin layer 180 disposed on the encapsulant 130. The first connection member 110 and the second connection member 140 may include, respectively, redistribution layers 112a and 112b and a redistribution layer 142 electrically connected to the connection pads 122 of the semiconductor chip 120. A rear redistribution layer 182 contacting the resin layer 180 may be embedded in the encapsulant 130. The rear redistribution layer 182 may be electrically connected to the redistribution layers 112a and 112b of the first connection member 110 through connection members 191 formed in first openings 181a penetrating through the resin layer 180 and the encapsulant 130.

Recently, in order to increase a memory capacity or improve operation performance of a semiconductor, a package-on-package structure in which pattern structures vertically transferring signals are formed in a semiconductor package and a homogeneous package or a heterogeneous package is vertically stacked on the semiconductor package has been variously developed. For example, a package-on-package structure in which an interposer substrate having a memory chip mounted thereon is stacked on a semiconductor package manufactured on the basis of a wafer and is electrically connected to the semiconductor package using solder balls, or the like, may be utilized.

However, in this case, it is difficult to thin the package-on-package structure due to a thickness of the interposer substrate. Therefore, forming a rear redistribution layer on an encapsulant of the semiconductor package disposed at a lower portion thereof, in order to omit the interposer substrate, may be considered. However, in this case, the rear redistribution layer should be additionally formed after a semiconductor chip is provided. Therefore, when a defect may occur in a process of forming the rear redistribution layer, the semiconductor chip should be also discarded, and a yield of the semiconductor chip may be thus decreased.

On the other hand, in a structure of the fan-out semiconductor package 100A according to the exemplary embodiment, the rear redistribution layer 182 may be formed on the resin layer 180 by a process separate from a process of encapsulating the semiconductor chip 120 with the encapsulant 130, and only good products, rather than bad products, among products in which the rear redistribution layer 182 is formed on the resin layer 180 may be selectively taken and may cover the encapsulant 130 encapsulating the semiconductor chip 120 to introduce the rear redistribution layer 182 to the encapsulant 130. Therefore, the decrease in the yield of the semiconductor chip 120 described above may be significantly reduced. Therefore, a cost required for manufacturing the fan-out semiconductor package 100A may be significantly reduced, and a time required for manufacturing the fan-out semiconductor package 100A may also be significantly reduced.

Meanwhile, the rear redistribution layer 182 of the fan-out semiconductor package 100A according to the exemplary embodiment may be electrically connected to the redistribution layers 112a and 112b of the first connection member 110 through the connection members 191 formed in the first openings 181a penetrating through the resin layer 180 and the encapsulant 130. In this case, the first openings 181a may expose at least portions of side surfaces of the rear redistribution layer 182, and the connection members 191 may contact the exposed side surfaces of the rear redistribution layer 182. In addition, the first openings 181a may expose at least portions of a surface of the second redistribution layer 112b of the first connection member 110, and the connection member 191 may contact the exposed surface of the redistribution layer 112b of the first connection member 110. The rear redistribution layer 182 and the redistribution layer 112b of the first connection member 110 may be connected to each other through the connection member 191, such that close adhesion may be stable at an interface. Therefore, reliability of the fan-out semiconductor package 100A may be further improved.

In addition, in the fan-out semiconductor package 100A according to the exemplary embodiment, positions in which the rear redistribution layer 182 and the redistribution layer 112b of the first connection member 110 are connected to each other may be exposed by the first openings 181a, such that a heat dissipation effect of dissipating heat generated in the semiconductor chip 120, or the like, may be significantly increased. In addition, the rear redistribution layer 182 may be formed on the resin layer 180 laminated on a detachable film 210 having a flat structure as described below, such that deviations in an insulation distance may be significantly reduced. Resultantly, an interval at which the fan-out semiconductor package 100A is bonded to a memory package, or the like, in the package-on-package structure may be uniformly maintained.

The respective components included in the fan-out semiconductor package 100A according to the exemplary embodiment will hereinafter be described below in more detail.

The first connection member 110 may include the redistribution layers 112a and 112b redistributing the connection pads 122 of the semiconductor chip 120 to thus reduce the number of layers of the second connection member 140. If necessary, the first connection member 110 may maintain rigidity of the fan-out semiconductor package 100A depending on certain materials, and serve to secure uniformity of a thickness of the encapsulant 130. In addition, due to the first connection member 110, the fan-out semiconductor package 100A according to the exemplary embodiment may be used as a portion of a package-on-package. The first connection member 110 may have the through-hole 110H. The through-hole 110H may have the semiconductor chip 120 disposed therein to be spaced apart from the first connection member 110 by a predetermined distance. Side surfaces of the semiconductor chip 120 may be surrounded by the first connection member 110. However, such a disposition is merely exemplary and may be variously modified to have other dispositions, and the fan-out semiconductor package 100A may perform another function depending on such a form.

The first connection member 110 may include an insulating layer 111 contacting the second connection member 140, a first redistribution layer 112a contacting the second connection member 140 and embedded in the insulating layer 111, and a second redistribution layer 112b disposed on the other surface of the insulating layer 111 opposing one surface of the insulating layer 111 in which the first redistribution layer 112a is embedded. The first connection member 110 may include vias 113 penetrating through the insulating layer 111 and electrically connecting the first and second redistribution layers 112a and 112b to each other. The first and second redistribution layers 112a and 112b may be electrically connected to the connection pads 122. When the first redistribution layer 112a is embedded in the insulating layer 111, a step portion generated due to a thickness of the first redistribution layer 112a may be significantly reduced, and an insulating distance of the second connection member 140 may thus become constant. That is, a difference between a distance from the redistribution layer 142 of the second connection member 140 to a lower surface of the insulating layer 111 and a distance from the redistribution layer 142 of the second connection member 140 to the connection pads 122 may be smaller than a thickness of the first redistribution layer 112a. Therefore, a high density wiring design of the second connection member 140 may be easy.

A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, an insulating material in which the thermosetting resin or the thermoplastic resin is impregnated together with an inorganic filler in a core material such as a glass cloth (or a glass fabric), for example, prepreg, Ajinomoto Build up Film (ABF), FR-4, Bismaleimide Triazine (BT), or the like. Alternatively, a photoimagable dielectric (PID) resin may also be used as the material of the insulating layer 111.

The redistribution layers 112a and 112b may serve to redistribute the connection pads 122 of the semiconductor chip 120. A material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may perform various functions depending on designs of their corresponding layers. For example, each of the redistribution layers 112a and 112b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, each of the redistribution layers 112a and 112b may include a via pad, a connection terminal pad, and the like.

Meanwhile, surface treatment layers (not illustrated) may be formed on surfaces of some of the pad patterns, or the like, exposed from the second redistribution layer 112b through the first openings 181a, if necessary. The surface treatment layers (not illustrated) are not particularly limited as long as they are known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like. In a case in which the surface treatment layers (not illustrated) are formed, the second redistribution layer 112b may be considered as a concept including the surface treatment layers in the present disclosure.

Figure 11A:
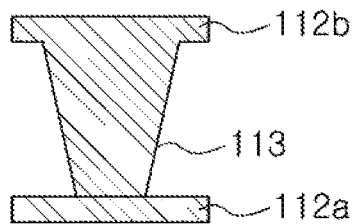
FIGS. 11A through 11D are schematic cross-sectional views illustrating various forms of vias formed in a first connection member of the fan-out semiconductor package of FIG. 9.
Figure 11B:
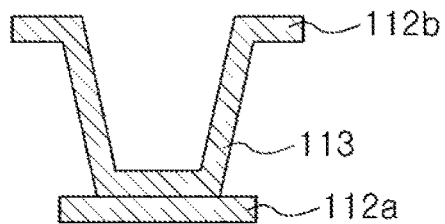
Figure 11C:
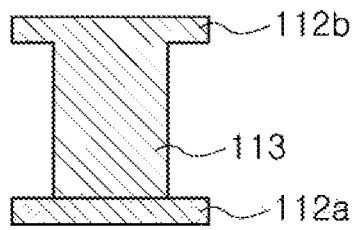
Figure 11D:
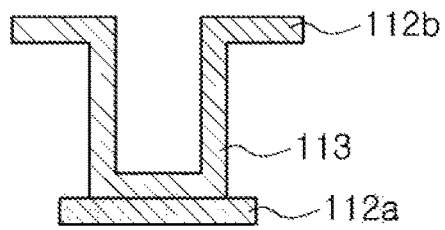

The vias 113 may electrically connect the redistribution layers 112a and 112b formed on different layers to each other, resulting in an electrical path in the first connection member 110. Each of the vias 113 may also be formed of a conductive material. Each of the vias 113 may be completely filled with the conductive material, as illustrated in FIGS. 11A and 11C, or the conductive material may also be formed along a wall of each of the vias 113, as illustrated in FIGS. 11B and 11D. In addition, each of the vias 113 may have all of the shapes known in the related art, such as a tapered shape, a cylindrical shape, and the like. Meanwhile, when holes for the vias 113 are formed, some of the pads of the first redistribution layer 112a may serve as a stopper, and it may be thus advantageous in a process that each of the vias 113 has the tapered shape of which a width of an upper surface is greater than that of a lower surface. In this case, the vias 113 may be integrated with portions of the second redistribution layer 112b.

The semiconductor chip 120 may be an integrated circuit (IC) provided in an amount of several hundreds to several millions of elements or more, integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pads 122 may have a step portion with respect to a lower surface of the encapsulant 130 through the passivation layer 123. Resultantly, a phenomenon in which the encapsulant 130 is bled to the lower surface of the connection pads 122 may be prevented to some degree. An insulating layer (not illustrated), and the like, may also be further disposed at other required positions.

The inactive surface of the semiconductor chip 120 may be disposed on a level below an upper surface of the second redistribution layer 112b of the first connection member 110. For example, the inactive surface of the semiconductor chip 120 may be disposed on a level below an upper surface of the insulating layer 111 of the first connection member 110. A height difference between the inactive surface of the semiconductor chip 120 and the upper surface of the second redistribution layer 112b of the first connection member 110 may be 2 μm or more, for example, 5 μm or more. In this case, the generation of cracks in corners of the inactive surface of the semiconductor chip 120 may be effectively prevented. In addition, a deviation of an insulating distance on the inactive surface of the semiconductor chip 120 in a case in which the encapsulant 130 is used may be significantly reduced.

The encapsulant 130 may protect the first connection member 110 and/or the semiconductor chip 120. An encapsulation form of the encapsulant 130 is not particularly limited, but may be a form in which the encapsulant 130 surrounds at least portions of the first connection member 110 and/or the semiconductor chip 120. For example, the encapsulant 130 may cover the first connection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second connection member 140. Meanwhile, the encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, a known molding material such as an EMC, or the like, may also be used. Alternatively, a material in which a thermosetting resin or a thermoplastic resin is impregnated together with an inorganic filler in a core material such as a glass cloth (or a glass fabric) may also be used as the insulating material.

Meanwhile, the encapsulant 130 may include conductive particles in order to block electromagnetic waves, if necessary. For example, the conductive particles may be any material that may block electromagnetic waves, for example, copper (Cu), aluminum (Al), silver (Ag), tin (Sn), gold (Au), nickel (Ni), lead (Pb), titanium (Ti), a solder, or the like. However, this is only an example, and the conductive particles are not particularly limited thereto.

The second connection member 140 may be configured to redistribute the connection pads 122 of the semiconductor chip 120. Several tens to several hundreds of connection pads 122 having various functions may be redistributed by the second connection member 140, and may be physically or electrically connected to an external source through connection terminals 170 to be described below depending on the functions. The second connection member 140 may include insulating layers 141, the redistribution layers 142 disposed on the insulating layers 141, and vias 143 penetrating through the insulating layers 141 and connecting the redistribution layers 142 to each other. In the fan-out semiconductor package 100A according to the exemplary embodiment, the second connection member 140 may include a single layer, but may also include a plurality of layers.

An insulating material may be used as a material of the insulating layers 141. In this case, a photosensitive insulating material such as a photoimagable dielectric (PID) resin may also be used as the insulating material. That is, the insulating layer 141 may be a photosensitive insulating layer. In a case in which the insulating layer 141 has a photosensitive property, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, each of the redistribution layers 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, each of the redistribution layers 142 may include a via pad, a connection terminal pad, and the like.

Meanwhile, surface treatment layers (not illustrated) may be formed on surfaces of some of the pad patterns, or the like, exposed from the second redistribution layer 142 of the second connection member 140 through openings 151 formed in a passivation layer 150 to be described below, if necessary. The surface treatment layers (not illustrated) are not particularly limited as long as they are known in the related art, and may be formed by, for example, electrolytic gold plating, electroless gold plating, OSP or electroless tin plating, electroless silver plating, electroless nickel plating/substituted gold plating, DIG plating, HASL, or the like. In a case in which the surface treatment layers (not illustrated) are formed, the second redistribution layers 142 of the second connection member 140 may be considered to conceptually include the surface treatment layers of the present disclosure.

The vias 143 may electrically connect the redistribution layers 142, the connection pads 122, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. The via 143 may be completely filled with the conductive material, or the conductive material may also be formed along a wall of the via. In addition, the via 143 may have any shape known in the related art, such as a tapered shape, a cylindrical shape, and the like.

Thicknesses of the redistribution layers 112a and 112b of the first connection member 110 may be greater than those of the redistribution layers 142 of the second connection member 140. Since the first connection member 110 may have a thickness equal to or greater than that of the semiconductor chip 120, the redistribution layers 112a and 112b formed in the first connection member 110 may be formed to have large sizes depending on a scale of the first connection member 110. On the other hand, the redistribution layers 142 of the second connection member 140 may be formed to have sizes relatively smaller than those of the redistribution layers 112a and 112b of the first connection member 110 for thinness of the second connection member 140. Similarly, the vias 113 of the first connection member 110 may have dimensions greater than those of the redistribution layers 142 of the second connection member 140.

The passivation layer 150 may be additionally configured to protect the second connection member 140 from external physical or chemical damage. The passivation layer 150 may have openings 151 formed of a plurality of holes exposing at least portions of the redistribution layer 142 of the second connection member 140. The number of openings 151 formed in the passivation layer 150 may be provided in an amount of several tens to several thousands.

A material having an elastic modulus greater than that of the insulating layer 141 of the second connection member 140 may be used as a material of the passivation layer 150. For example, ABF that does not include a glass cloth (or a glass fabric), but includes an inorganic filler and an insulating resin, or the like, may be used as the material of the passivation layer 150. When the ABF, or the like, is used as the material of the passivation layer 150, a weight percent of the inorganic filler included in the passivation layer 150 may be greater than that of the inorganic filler included in the insulating layer 141 of the second connection member 140. In this condition, reliability may be improved. When the ABF, or the like, is used as the material of the passivation layer 150, the passivation layer 150 may be a non-photosensitive insulating layer including the inorganic filler, and may be effective in improving reliability, but is not limited thereto.

An underbump metal layer 160 may be additionally configured to improve connection reliability of the connection terminals 170 and improve board level reliability of the fan-out semiconductor package 100A. The underbump metal layer 160 may be connected to the redistribution layer 142 of the second connection member 140 exposed through the openings 151 of the passivation layer 150. The underbump metal layer 160 may be formed in the openings 151 of the passivation layer 150 by the known metallization method using the known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed of multiple layers or a single layer. When the connection terminals 170 are formed of the multiple layers, the connection terminals 170 may include a copper pillar and a solder. When the connection terminals 170 are formed of the single layer, the connection terminals 170 may include a tin-silver solder or copper. However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for the region in which the semiconductor chip 120 is provided. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

The resin layer 180 may be for separately manufacturing the rear redistribution layer 182 and introducing only good products among products including the separately manufactured rear redistribution layer 182 into the fan-out semiconductor package 100A. The known insulating material such as ABF including an inorganic filler and an insulating resin, prepreg including a glass cloth (or a glass fabric), or the like, may be used as a material of the resin layer 180. A weight percent of the inorganic filler included in the resin layer 180 may be greater than that of the inorganic filler included in the encapsulant 130. In this condition, generation of warpage of the fan-out semiconductor package 100A due to a difference in coefficients of thermal expansion (CTE) between the resin layer 180 and the encapsulant 130 may be significantly reduced without causing a defect such as delamination of the encapsulant 130. Meanwhile, in a case in which the resin layer 180 includes a material that is the same as or similar to that of the passivation layer 150, for example, in a case in which both of the resin layer 180 and the passivation layer 150 include the ABF including the inorganic filler and the insulating resin, warpage of the fan-out semiconductor package 100A may be more effectively controlled.

The first openings 181a may penetrate through the resin layer 180 and the encapsulant 130. The first openings 181a may expose at least portions of the side surfaces of the rear redistribution layer 182. In addition, the first openings 181a may expose at least portions of the surface of the second redistribution layer 112b of the first connection member 110. The connection members 191 may be formed in the first openings 181a. Therefore, the connection members 191 may contact the exposed side surfaces of the rear redistribution layer 182 and the exposed surface of the second redistribution layer 112b of the first connection member 110. Resultantly, the rear redistribution layer 182 and the redistribution layer 112b of the first connection member 110 may be connected to each other through the connection members 191. In such a form, interface close adhesion may be stable. Therefore, reliability of the fan-out semiconductor package 100A may be further improved. In addition, portions at which the rear redistribution layer 182 and the redistribution layer 112b of the first connection member 110 are connected to each other may be opened through the first openings 181a, such that a heat dissipation effect of dissipating heat generated in the semiconductor chip 120, or the like, may be significantly increased.

Second openings 181b may penetrate through the resin layer 180. The second openings 181a may not penetrate the rear redistribution layer 182 and may expose at least portions of a surface of the rear redistribution layer 182. The exposed surface of the rear redistribution layer 182 may be used as markings, pads for solder balls, surface mounted components, or the like, pads for a package-on-package structure, or the like. A surface treatment layer (not illustrated) may be formed on the exposed surface of the rear redistribution layer 182 by electrolytic gold plating, electroless gold plating, OSP or electroless tin plating, electroless silver plating, electroless nickel plating/substituted gold plating, DIG plating, HASL, or the like.

The rear redistribution layer 182 may serve to redistribute the connection pads 122 of the semiconductor chip 120, and may also serve to distribute a memory chip, or the like, mounted on the resin layer 180, instead of an interposer substrate, in a case in which the fan-out semiconductor package 100A according to the exemplary embodiment is used in a package-on-package structure. A material of the rear redistribution layer 182 may be a conductive material such as copper (Cu), aluminum (Al), silver (Ag), tin (Sn), gold (Au), nickel (Ni), lead (Pb), titanium (Ti), or alloys thereof. The rear redistribution layer 182 may perform various functions depending on designs of its corresponding layer. For example, the rear redistribution layer 182 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the rear redistribution layer 182 may include a via pad, a connection terminal pad, and the like.

The rear redistribution layer 182 may include a seed layer 182a formed on the resin layer 180 and a conductor layer 182b formed on the seed layer 182a, as described below. Each of the seed layer 182a and the conductor layer 182b may include the known conductive material such as copper (Cu). The seed layer 182a may contact the resin layer 180. The conductor layer 182b may contact the encapsulant 130, and may be spaced apart from the resin layer 180. The seed layer 180a may serve as a seed, and a thickness of the seed layer 182a may be thus thinner than that of the conductor layer 182b. In some cases, at least one of chemical reaction groups included in the insulating resin constituting the resin layer 180 may be self-assembled to a metal of the seed layer 182a formed on a surface of the resin layer 180. In this case, the seed layer 182a and the resin layer 180 may have more excellent close adhesion therebetween.

The rear redistribution layer 182 may be formed on the resin layer 180 laminated on a detachable film 210 having a flat structure as described below, such that a deviation of an insulation distance may be significantly reduced. Therefore, when the fan-out semiconductor package 100A is used in the package-on-package structure, an interval at which the fan-out semiconductor package 100A is bonded to an upper package such as a memory package may be uniformly maintained.

The connection members 191 may electrically connect the rear redistribution layer 182 and the redistribution layer 112b of the first connection member 110 to each other. Resultantly, an electrical path may be formed in the fan-out semiconductor package 100A. If necessary, the connection members 191 may also serve as terminals connected to a separate package when the fan-out semiconductor package 100A is utilized in the package-on-package structure. The connection members 191 may include solders, or the like. The connection members 191 may be, for example, solder balls, but are not limited thereto.

Although not illustrated in the drawings, a metal layer may be further disposed on an inner wall of the through-hole 110 of the first connection member 110, if necessary. That is, the side surfaces of the semiconductor chip 120 may also be surrounded by the metal layer. Heat generated from the semiconductor chip 120 may be effectively radiated in an upward or downward direction of the fan-out semiconductor package 100A through the metal layer, and an electromagnetic wave may be effectively blocked through the metal layer. In addition, if necessary, a plurality of semiconductor chips may be disposed in the through-hole 110H of the first connection member 110, and the number of through-holes 110H of the first connection member 110 may be plural and semiconductor chips may be disposed in the through-holes, respectively. In addition, separate passive components such as a condenser, an inductor, and the like, may be disposed together with the semiconductor chip in the through-hole 110H. In addition, a surface mounted component may also be mounted on the passivation layer 150 to be positioned on a level that is substantially the same as that of the connection terminal 170.

FIGS. 12A through 12D are views illustrating an example of processes of manufacturing the fan-out semiconductor package of FIG. 9.

Figure 12A:
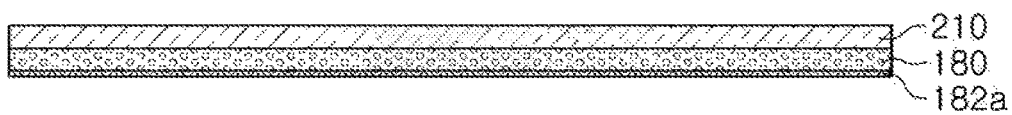
FIGS. 12A through 12D are views illustrating an example of processes of manufacturing the fan-out semiconductor package of FIG. 9.
Figure 12A:
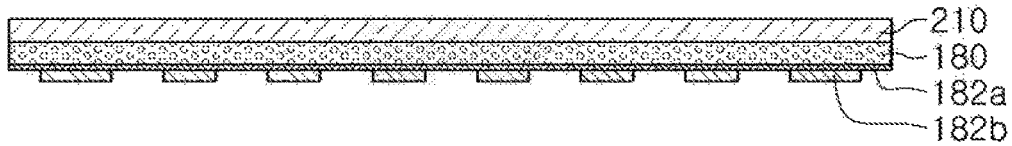
Figure 12A:
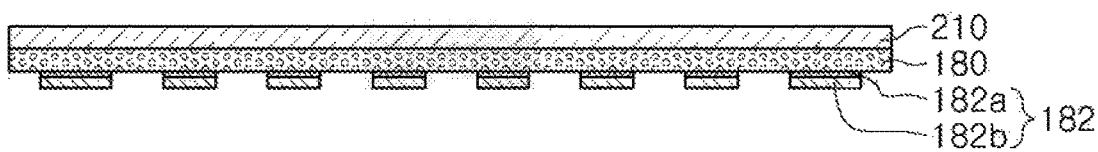

Referring to FIG. 12A, the resin layer 180 and the rear redistribution layer 182 may be formed on the detachable film 210 by separate processes. For example, the resin layer 180 may be laminated on the known detachable film 210, the seed layer 182a may be formed on the resin layer 180 by the known plating method, the patterned conductor layer 182b may be formed on the seed layer 182a, and portions of the seed layer 182a except for patterns may be removed by etching, or the like. The plating may be performed using the known method such as electroplating, electroless plating, chemical vapor deposition (CVD), physical vapor deposition (PVD), sputtering, a subtractive process, an additive process, a semi-additive process (SAP), a modified semi-additive process (MSAP), or the like. Only the rear redistribution layer 182 of good products among manufactured products may be selected.

Figure 12B:
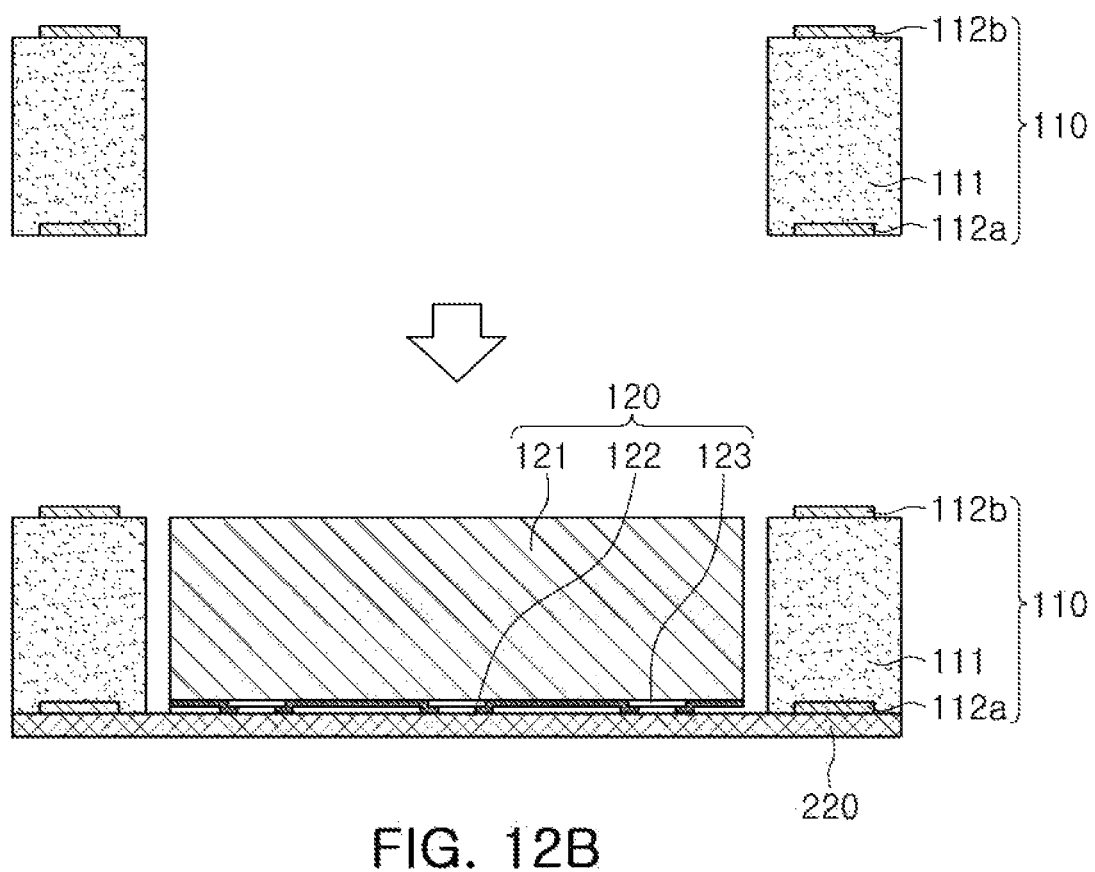

Referring to FIG. 12B, the semiconductor chip 120 may be disposed in the through-hole 110H of the first connection member 110 using a temporary film 220 such as an adhesive film, or the like, by a separate process independent from the processes shown in FIG. 12A described above. For example, the first connection member 110 may be formed, the first connection member 110 may be attached onto the temporary film 220, and the semiconductor chip 120 may be attached onto and disposed on the temporary film 220 exposed through the through-hole 110H in a face-down form. Only a good product of the first connection member 110 may be selected before the semiconductor chip 120 is disposed, and a yield of the semiconductor chip 120 may be thus further improved also in this process. Meanwhile, the first connection member 110 may be formed by forming the first redistribution layer 112a on a carrier film, forming the insulating layer 111 burying the first redistribution layer 112a therein, forming the vias 113 penetrating through the insulating layer 111, forming the second redistribution layer 112b on the insulating layer 111, and separating them from the carrier film.

Figure 12C:
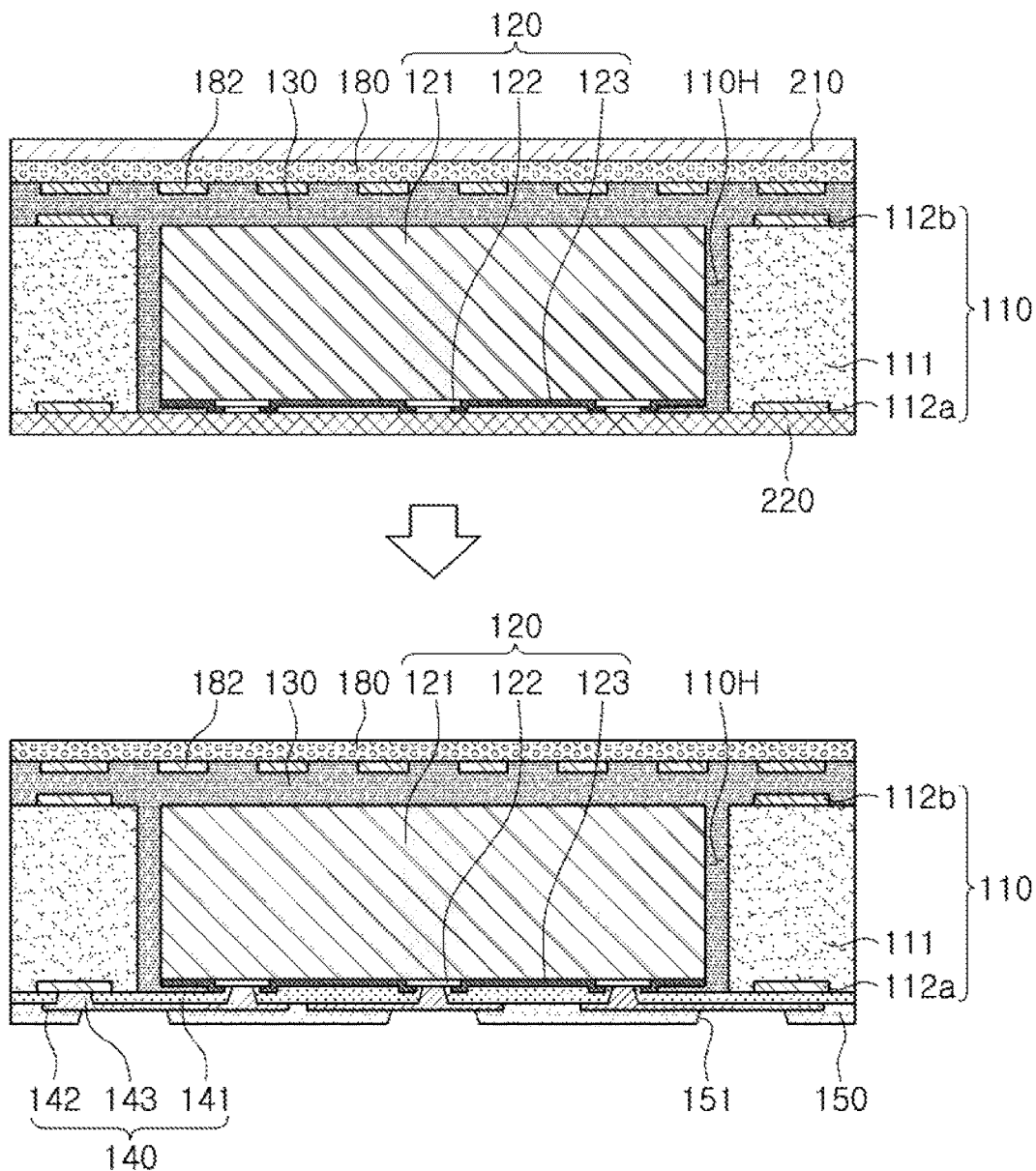

Referring to FIG. 12C, the semiconductor chip 120 may be encapsulated using the encapsulant 130. The encapsulant 130 may encapsulate at least the first connection member 110 and the inactive surface of the semiconductor chip 120, and may fill a space within the through-hole 110H. The encapsulant 130 may be formed by the known method. For example, the encapsulant 130 may be formed by a method of laminating a precursor of the encapsulant 130 and then hardening the precursor. Alternatively, the encapsulant 130 may be formed by a method of applying a pre-encapsulant onto the temporary film 220 so as to encapsulate the semiconductor chip 120 and then hardening the pre-encapsulant. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As the method of applying the pre-encapsulant, for example, a screen printing method of applying ink with a squeegee, a spray printing method of applying ink in a mist form, or the like, may be used. The semiconductor chip 120 may be fixed by the hardening. Then, the detachable film 210 on which the rear redistribution layer 182 and the resin layer 180 are separately formed may be laminated on the encapsulant 130 so that the rear redistribution layer 182 is embedded in the encapsulant 130. Then, the detachable film 210 may be removed. In addition, the temporary film 220 may be removed. The second connection member 140 may be formed in a region in which the temporary film 220 is removed, using a fine semiconductor process, or the like. The second connection member 140 may be formed by forming the insulating layer 141 and then forming the redistribution layers 142 and the vias 143. If necessary, the passivation layer 150 may be formed on the second connection member 140 by a lamination method, or the like, and the openings 151 may be formed in the passivation layer 150.

Figure 12D:
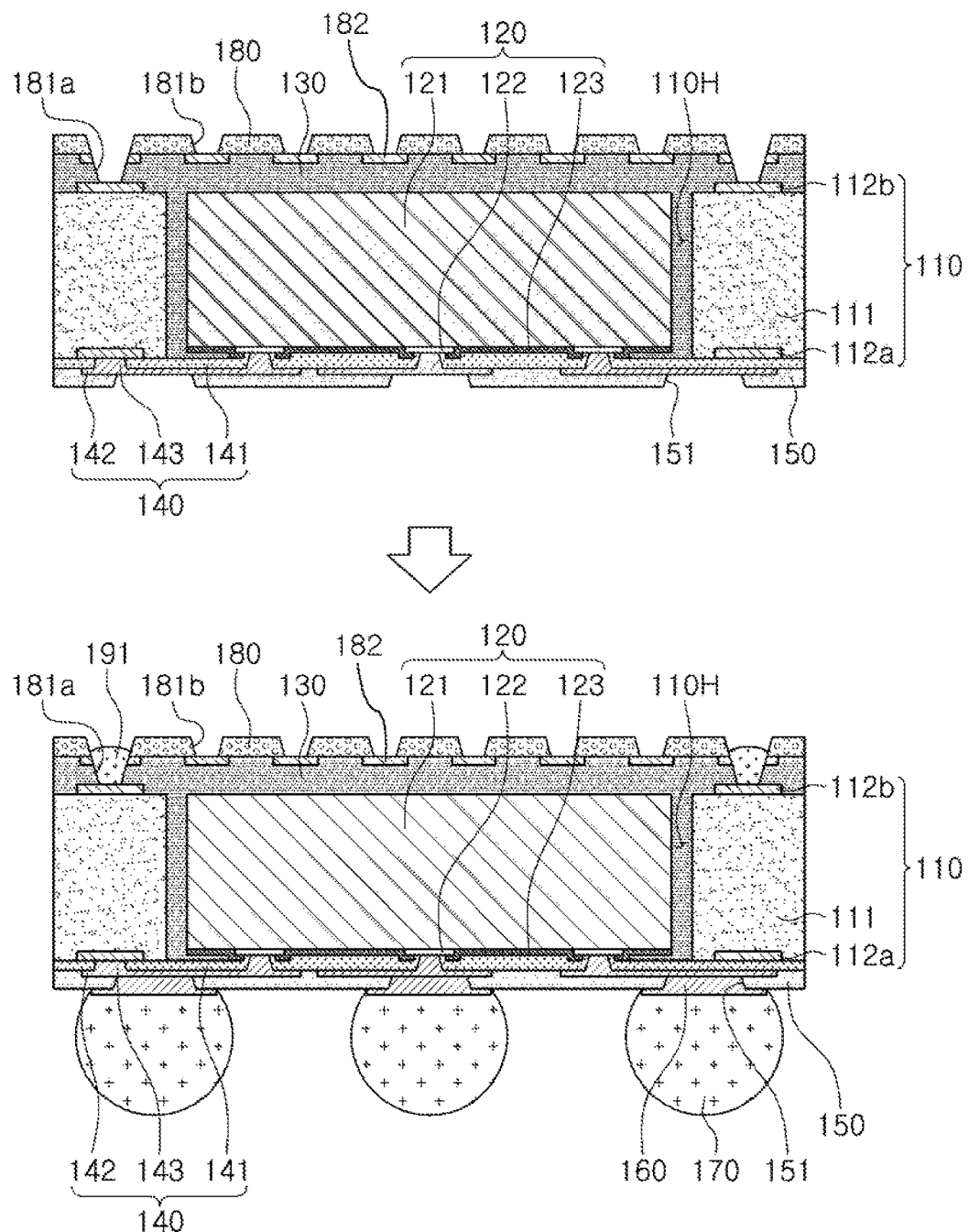

Referring to FIG. 12D, the first openings 181a and the second openings 181b may be formed. The first openings 181a and the second openings 181b may be formed using mechanical drilling, laser drilling, or the like. The first openings 181a and the second openings 181b may also be formed by a photolithography method depending on insulating materials of the resin layer 180 and the encapsulant 130. Then, the connection members 191 may be formed in the first openings 181a. The connection members 191 may be solder balls, but are not limited thereto. The underbump metal layer 160, the connection terminals 170, and the like, may be formed by the known method, if necessary.

Figure 13:
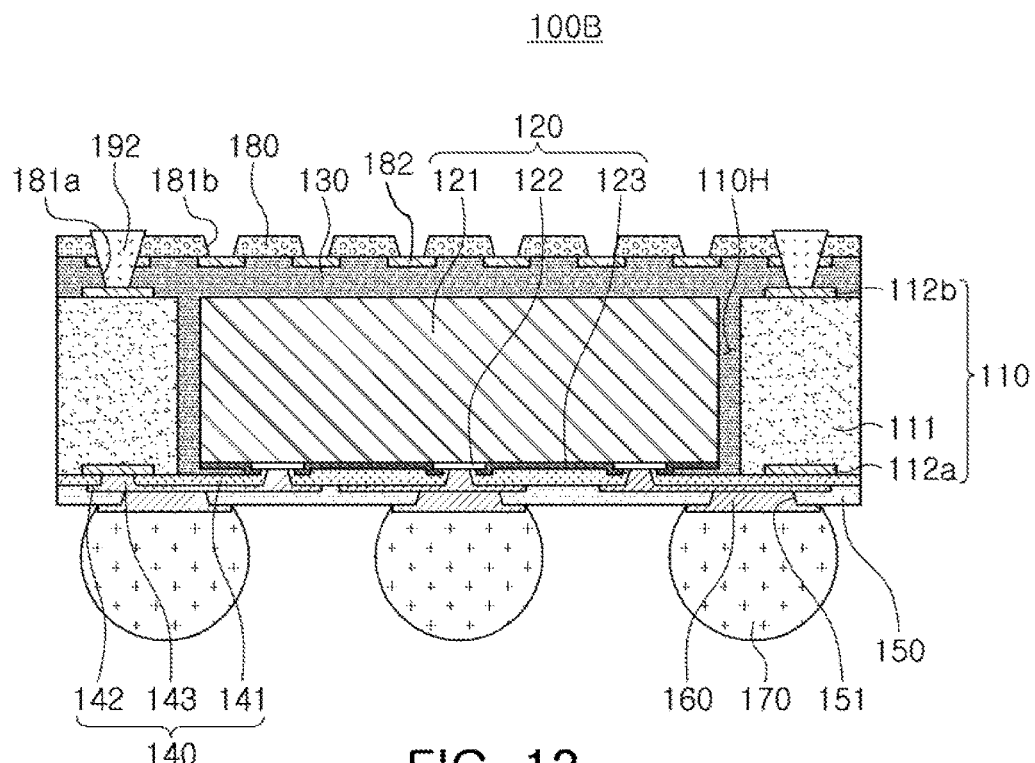
FIG. 13 is a schematic cross-sectional view illustrating another example of a fan-out semiconductor package.

FIG. 13 is a schematic cross-sectional view illustrating another example of a fan-out semiconductor package.

Referring to the drawing, a fan-out semiconductor package 100B according to another exemplary embodiment in the present disclosure may include connection members 192 formed of a metal paste. For example, the connection members 192 may be metal pillars formed by applying the metal paste to first openings 181a and sintering the applied metal paste, but are not limited thereto. A description of other configurations and a manufacturing method except for the abovementioned configuration overlaps that described above, and is thus omitted.

Figure 14:
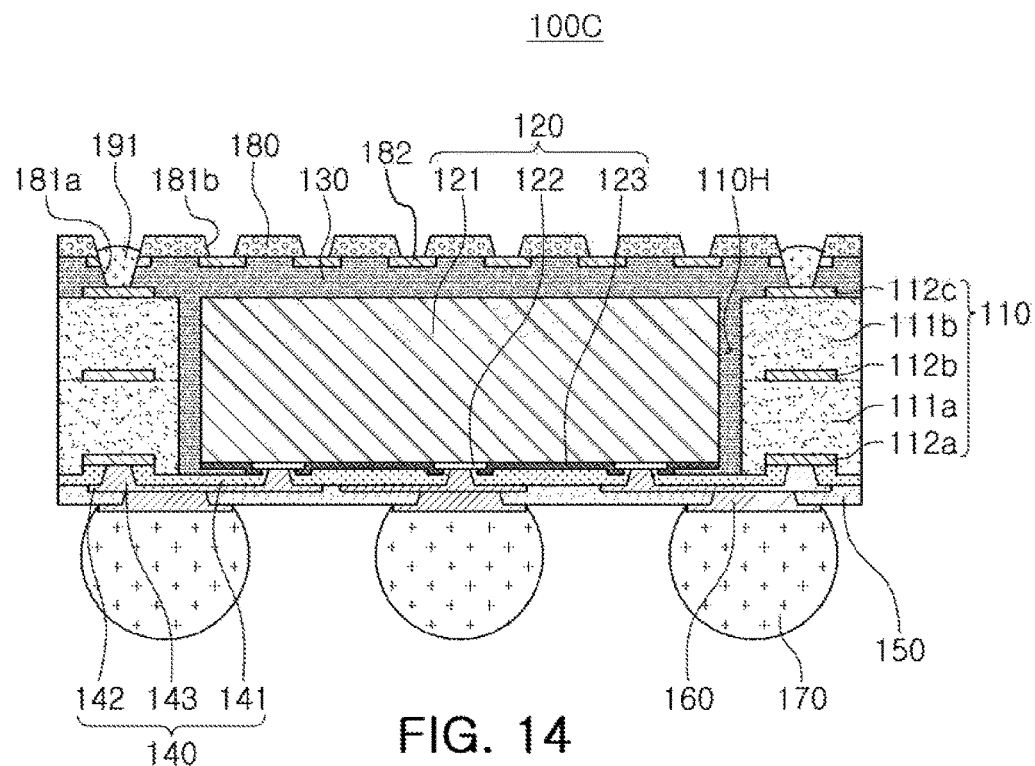
FIG. 14 is a schematic cross-sectional view illustrating another example of a fan-out semiconductor package.

FIG. 14 is a schematic cross-sectional view illustrating another example of a fan-out semiconductor package.

Referring to the drawing, in a fan-out semiconductor package 100C according to another exemplary embodiment in the present disclosure, a first connection member 110 may include a first insulating layer 111a contacting a second connection member 140, a first redistribution layer 112a contacting the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. Meanwhile, the first and second redistribution layers 112a and 112b and the second and third redistribution layers 112b and 112c may be electrically connected to each other through first and second vias (not illustrated) penetrating through the first and second insulating layers 111a and 111b, respectively.

Since the first redistribution layer 112a is embedded, an insulating distance of an insulating layer 141 of the second connection member 140 may be substantially constant, as described above. Since the first connection member 110 may include a large number of redistribution layers 112a, 112b, and 112c, the second connection member 140 may be further simplified. Therefore, a decrease in a yield depending on a defect occurring in a process of forming the second connection member 140 may be improved. The first redistribution layer 112a may be recessed in the first insulating layer 111a, such that a lower surface of the first insulating layer 111a and a lower surface of the first redistribution layer 112a have a step portion therebetween. Resultantly, when an encapsulant 130 is formed, a phenomenon in which a material of the encapsulant 130 is bled to pollute the first redistribution layer 112a may be prevented.

The lower surface of the first redistribution layer 112a of the first connection member 110 may be disposed on a level above a lower surface of the connection pads 122 of the semiconductor chip 120. In addition, a distance between a redistribution layer 142 of the second connection member 140 and the redistribution layer 112a of the first connection member 110 may be greater than that between the redistribution layer 142 of the second connection member 140 and the connection pads 122 of the semiconductor chip 120. In this regard, the first redistribution layer 112a may be recessed in the insulating layer 111. The second redistribution layer 112b of the first connection member 110 may be disposed on a level between an active surface and an inactive surface of the semiconductor chip 120. The first connection member 110 may be formed to have thickness corresponding to that of the semiconductor chip 120. Therefore, the second redistribution layer 112b formed in the first connection member 110 may be disposed on a level between the active surface and the inactive surface of the semiconductor chip 120.

Thicknesses of the redistribution layers 112a, 112b, and 112c of the first connection member 110 may be greater than that of the redistribution layer 142 of the second connection member 140. Since the first connection member 110 may have a thickness equal to or greater than that of the semiconductor chip 120, the redistribution layers 112a, 112b, and 112c may be formed to have large sizes depending on a scale of the first connection member 110. On the other hand, the redistribution layer 142 of the second connection member 140 may be formed to have a relatively small size for thinness.

A description of configurations and a manufacturing method other than the above-mentioned configuration will be provided hereinafter. Meanwhile, the description of the fan-out semiconductor package 100B described above may also be applied to the fan-out semiconductor package 100C.

Figure 15:
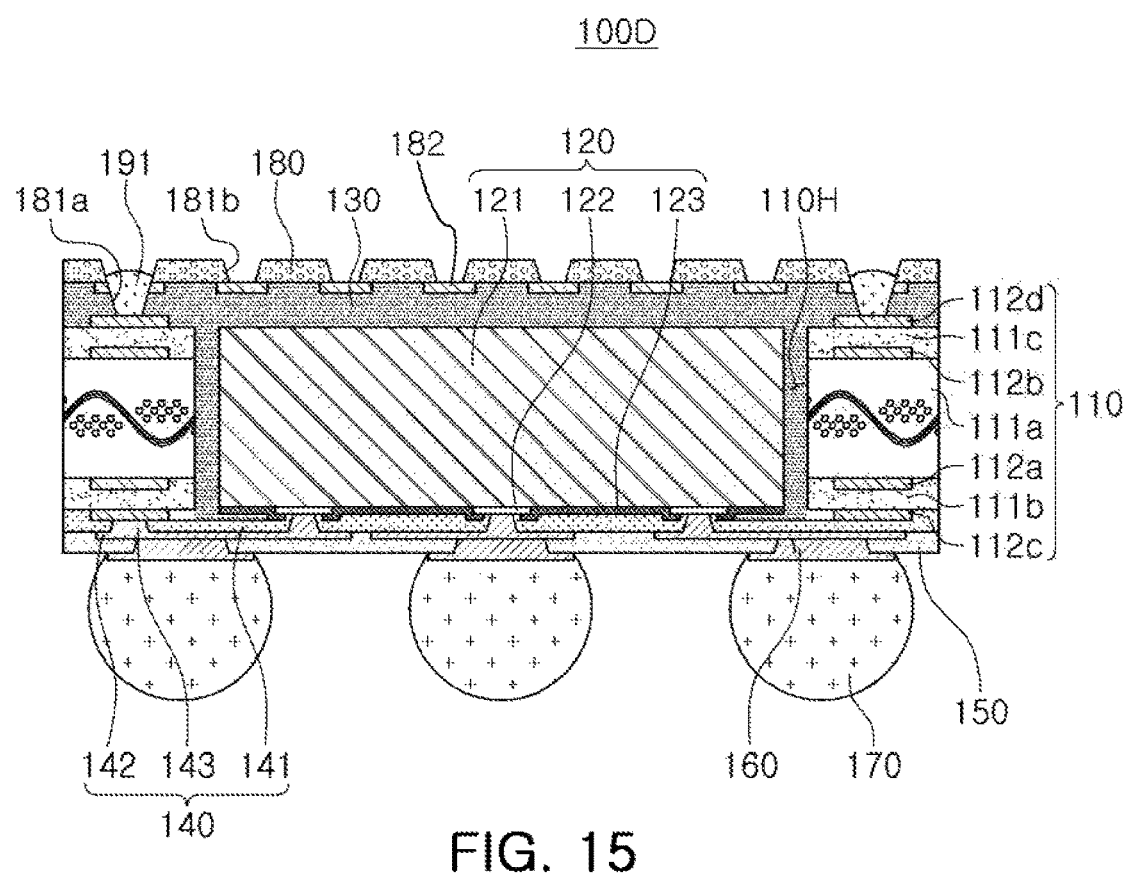
FIG. 15 is a schematic cross-sectional view illustrating another example of a fan-out semiconductor package.

FIG. 15 is a schematic cross-sectional view illustrating another example of a fan-out semiconductor package.

Referring to the drawing, in a fan-out semiconductor package 100D according to another exemplary embodiment in the present disclosure, a first connection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first connection member 110 may include a larger number of redistribution layers 112a, 112b, 112c, and 112d, the second connection member 140 may be further simplified. Therefore, a decrease in a yield, depending on a defect occurring in a process of forming the second connection member 140, may be improved. Meanwhile, the first to fourth redistribution layers 112a, 112b, 112c, and 112d may be electrically connected to each other through first to third vias (not illustrated) penetrating through the first to third insulating layers 111a, 111b, and 111c.

The first insulating layer 111a may have a thickness greater than those of the second insulating layer 111b and the third insulating layer 111c. The first insulating layer 111a may basically be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first connection member 110 may be disposed on a level below a lower surface of the connection pads 122 of the semiconductor chip 120. In addition, a distance between a redistribution layer 142 of the second connection member 140 and the third redistribution layer 112c of the first connection member 110 may be smaller than that between the redistribution layer 142 of the second connection member 140 and the connection pads 122 of the semiconductor chip 120. In this regard, the third redistribution layer 112c may be disposed on the second insulating layer 111b in a protruding form, resulting in contacting the second connection member 140. The first redistribution layer 112a and the second redistribution layer 112b of the first connection member 110 may be disposed on a level between an active surface and an inactive surface of the semiconductor chip 120. The first connection member 110 may be formed to have thickness corresponding to that of the semiconductor chip 120. Therefore, the first redistribution layer 112a and the second redistribution layer 112b formed in the first connection member 110 may be disposed on a level between the active surface and the inactive surface of the semiconductor chip 120.

Thicknesses of the redistribution layers 112a, 112b, 112c, and 112d of the first connection member 110 may be greater than that of the redistribution layer 142 of the second connection member 140. Since the first connection member 110 may have a thickness equal to or greater than that of the semiconductor chip 120, the redistribution layers 112a, 112b, 112c, and 112d may also be formed to have large sizes. On the other hand, the redistribution layer 142 of the second connection member 140 may be formed to have a relatively small size for thinness.

A description of other configurations and a manufacturing method except for the abovementioned configuration overlaps that described above, and is thus omitted. Meanwhile, the description of the fan-out semiconductor package 100B described above may also be applied to the fan-out semiconductor package 100D.

As set forth above, according to the exemplary embodiment in the present disclosure, a fan-out semiconductor package in which a decrease in a yield of a semiconductor chip may be significantly reduced may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first connection member having a through-hole;
a semiconductor chip disposed in the through-hole of the first connection member and having an active surface having connection pads disposed thereon and an inactive surface opposing the active surface;
an encapsulant encapsulating at least portions of the first connection member and the inactive surface of the semiconductor chip;
a second connection member disposed on the first connection member and the active surface of the semiconductor chip;
a rear redistribution layer embedded in the encapsulant and disposed spaced apart from the first connection member, one surface of the rear redistribution layer exposed by the encapsulant; and
a conductive connection member penetrating through the rear redistribution layer and the encapsulant,
wherein the first connection member and the second connection member include, respectively, redistribution layers electrically connected to the connection pads of the semiconductor chip, and
the rear redistribution layer is electrically connected to the redistribution layer of the first connection member through the conductive connection member, and is electrically connected to the connection pads of the semiconductor chip through the redistribution layer of the first connection member and the redistribution layer of the second connection member.

2. The fan-out semiconductor package of claim 1, wherein exposed side surfaces of the rear redistribution layer.

3. The fan-out semiconductor package of claim 1, further comprising a resin layer disposed on the encapsulant,
wherein the resin layer includes openings exposing at least portions of a surface of the rear redistribution layer.

4. The fan-out semiconductor package of claim 1, wherein the conductive connection member includes a solder or a metal paste.

5. The fan-out semiconductor package of claim 3, wherein the rear redistribution layer includes a seed layer formed on the resin layer and a conductor layer formed on the seed layer, and the conductor layer is thicker than the seed layer.

6. The fan-out semiconductor package of claim 1, wherein the first connection member includes a first insulating layer, a first redistribution layer contacting the second connection member and embedded in the first insulating layer, and a second redistribution layer disposed on the other surface of the first insulating layer opposing one surface of the first insulating layer in which the first redistribution layer is embedded, and
the first and second redistribution layers are electrically connected to the connection pads.

7. The fan-out semiconductor package of claim 6, wherein the first connection member further includes a second insulating layer disposed on the first insulating layer and covering the second redistribution layer and a third redistribution layer disposed on the second insulating layer, and
the third redistribution layer is electrically connected to the connection pads.

8. The fan-out semiconductor package of claim 6, wherein a distance between the redistribution layer of the second connection member and the first redistribution layer is greater than that between the redistribution layer of the second connection member and the connection pads.

9. The fan-out semiconductor package of claim 6, wherein the first redistribution layer has a thickness greater than that of the redistribution layer of the second connection member.

10. The fan-out semiconductor package of claim 6, wherein a lower surface of the first redistribution layer is disposed on a level above a lower surface of the connection pads.

11. The fan-out semiconductor package of claim 1, wherein the first connection member includes a first insulating layer, and a first redistribution layer and a second redistribution layer respectively disposed on opposite surfaces of the first insulating layer,
the first and second redistribution layers are electrically connected to the connection pads.

12. The fan-out semiconductor package of claim 11, wherein the first redistribution layer has a thickness greater than that of the redistribution layer of the second connection member.

13. The fan-out semiconductor package of claim 11, wherein the first connection member further includes a second insulating layer disposed on the first insulating layer and covering the first redistribution layer, and a third redistribution layer disposed on the second insulating layer, and
the third redistribution layer is electrically connected to the connection pads.

14. The fan-out semiconductor package of claim 13, wherein the first connection member further includes a third insulating layer disposed on the first insulating layer and covering the second redistribution layer and a fourth redistribution layer disposed on the third insulating layer, and
the fourth redistribution layer is electrically connected to the connection pads.

15. The fan-out semiconductor package of claim 13, wherein the first insulating layer has a thickness greater than that of the second insulating layer.

16. The fan-out semiconductor package of claim 13, wherein a lower surface of the third redistribution layer is disposed on a level below a lower surface of the connection pads.

17. The fan-out semiconductor package of claim 1, wherein the conductive connection member protrudes from a resin layer disposed on the encapsulant.

18. A fan-out semiconductor package comprising:
a first connection member having a through-hole;
a semiconductor chip disposed in the through-hole of the first connection member and having an active surface having connection pads disposed thereon and an inactive surface opposing the active surface;
a second connection member disposed on the first connection member and the active surface of the semiconductor chip;
a resin layer, the semiconductor chip disposed between the resin layer and the second connection member; and a rear redistribution layer embedded in an encapsulant and having one surface exposed by the encapsulant, the semiconductor chip disposed between the rear redistribution layer and the second connection member; and a conductive connection member penetrating through the rear redistribution layer and the encapsulant, wherein the encapsulant is disposed between the resin layer, and the first connection member and the semiconductor chip, and wherein the rear redistribution layer, and redistribution layers of the first connection member and the second connection member, are electrically connected to the connection pads of the semiconductor chip.

19. The fan-out semiconductor package of claim 18, wherein the rear redistribution layer is electrically connected to the redistribution layer of the first connection member through the conductive connection member formed in first openings penetrating through the resin layer and the encapsulant.

20. The fan-out semiconductor package of claim 18, wherein the rear redistribution layer includes a seed layer and a conductor layer having a thickness greater than that of the seed layer, and the seed layer is disposed between the resin layer and the conductor layer.

21. A fan-out semiconductor package comprising:
a first connection member having a through-hole;
a semiconductor chip disposed in the through-hole of the first connection member and having an active surface having connection pads disposed thereon and an inactive surface opposing the active surface;
an encapsulant encapsulating portions of the first connection member and the inactive surface of the semiconductor chip;
a second connection member facing the active surface and disposed on the first connection member and the semiconductor chip; and
a rear redistribution layer embedded in the encapsulant and facing the inactive surface of the semiconductor chip,
wherein the rear redistribution layer is electrically connected to the connection pads of the semiconductor chip through redistribution layers of the first and second connection members and through a conductive connection member, and
the conductive connection member at least partially fills an opening penetrating through the rear redistribution layer and the encapsulant, and is in contact with the rear redistribution layer and one of the redistribution layers of the first connection member.

* * * * *